(12) United States Patent
Shiu et al.

(10) Patent No.: US 9,425,374 B2
(45) Date of Patent: Aug. 23, 2016

(54) ELECTRONIC APPARATUS AND PROTECTIVE COVER OF MOBILE DEVICE

(71) Applicant: HTC Corporation, Taoyuan County (TW)

(72) Inventors: Yao-Wen Shiu, Taoyuan County (TW);
Chu-Yang Hsu, Taoyuan County (TW);
Che-Chuan Hu, Taoyuan County (TW);
Tzu-Chia Tan, Taoyuan County (TW);
Chan-Hung Liu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 43 days.

(21) Appl. No.: 14/102,508

(22) Filed: Dec. 11, 2013

(65) Prior Publication Data

US 2015/0162515 A1    Jun. 11, 2015

(51) Int. Cl.
*H04M 1/00*    (2006.01)
*H01L 35/32*    (2006.01)
*H04B 1/3888*    (2015.01)

(52) U.S. Cl.
CPC .............. *H01L 35/32* (2013.01); *H04B 1/3888* (2013.01)

(58) Field of Classification Search
CPC ........... H04M 1/18; H04M 1/04; H04M 1/23; H04B 1/3883; H04B 1/3888
USPC .................................... 455/573, 575.1, 575.8
See application file for complete search history.

(56) References Cited

U.S. PATENT DOCUMENTS

| 5,230,016 | A | * | 7/1993 | Yasuda | H02J 7/0044 379/426 |
| 6,426,921 | B1 | * | 7/2002 | Mitamura | G04C 10/00 136/205 |
| 6,787,691 | B2 | * | 9/2004 | Fleurial | H01L 35/16 136/203 |
| 7,447,033 | B2 | * | 11/2008 | Ali | G06F 1/203 165/80.3 |
| 8,222,990 | B2 | * | 7/2012 | Gerner | G07C 9/00309 307/48 |
| 8,492,958 | B2 | | 7/2013 | Skotnicki | |

(Continued)

FOREIGN PATENT DOCUMENTS

| CN | 102201761 A | 9/2011 |
| TW | 201042789 A | 12/2010 |
| TW | M443366 U | 12/2012 |

OTHER PUBLICATIONS

Corresponding Taiwanese Office Action that these art references were cited on Jul. 13, 2015.

*Primary Examiner* — Md Talukder
(74) *Attorney, Agent, or Firm* — CKC & Partners Co., Ltd.

(57) ABSTRACT

An electronic apparatus and a protective cover for a mobile device are disclosed. The protective cover is removably attached on an outer surface of a mobile device. The protective cover comprises an outer protective layer, a thermo-conductive layer and a thermoelectric material layer. The thermo-conductive layer is attached on the outer surface of the mobile device. The thermoelectric material layer has a first side adjacent to the thermo-conductive layer and a second side adjacent to the outer protective layer. The thermoelectric material layer generates a current according to a temperature difference between the first side and the second side.

12 Claims, 5 Drawing Sheets

(56) References Cited

U.S. PATENT DOCUMENTS

| | | | |
|---|---|---|---|
| 8,552,541 B2* | 10/2013 | Lim | H01L 23/4334 257/675 |
| 8,571,598 B2* | 10/2013 | Valavi | G06F 1/1626 455/456.6 |
| 9,300,347 B1* | 3/2016 | Coverstone | H04B 1/3888 |
| 2010/0008028 A1* | 1/2010 | Richardson | G06F 1/1626 361/679.01 |
| 2011/0095646 A1* | 4/2011 | Skotnicki | H02N 2/18 310/306 |
| 2011/0290294 A1* | 12/2011 | Lee | H01L 35/34 136/207 |
| 2012/0032876 A1* | 2/2012 | Tabe | H04B 1/3838 345/156 |
| 2012/0260963 A1* | 10/2012 | Lin | H02S 10/10 136/206 |
| 2013/0157729 A1* | 6/2013 | Tabe | H04W 52/0245 455/573 |
| 2013/0277084 A1* | 10/2013 | McCarthy | A45C 11/00 174/50 |
| 2014/0014154 A1* | 1/2014 | Hayashi | H01L 35/32 136/205 |
| 2014/0192480 A1* | 7/2014 | Winkler | G06F 1/203 361/679.47 |
| 2014/0220270 A1* | 8/2014 | Hung | H04M 1/185 428/34.1 |
| 2015/0162515 A1* | 6/2015 | Shiu | H04B 1/3888 455/575.8 |

* cited by examiner

ELECTRONIC APPARATUS AND PROTECTIVE COVER OF MOBILE DEVICE

BACKGROUND

1. Field of Invention

The present application relates to a protective structure. More particularly, the present application relates to a protective cover which is removably attached on a mobile device.

2. Description of Related Art

Portable consumer-electronic products are popular and widespread recently. Especially, mobile devices, such as smart phones, tablet computers and Mobile Internet Device (MID), have become necessary belongings to people in the modern society. Mobile devices usually include various functions (websites surfing, multimedia playing, telecommunication, three-dimensional images displaying/drawing, games playing, etc), which cause heavy demands for high-speed computations. Mobile processors on these devices evolutes from time to time. The performance of the mobile processors approaches to one of the regular processors.

As the demand for processing speed increases, battery durability and heat dissipation have become critical issues while designing the mobile devices. Because sizes of mobile devices must be compact for portability, space on the mobile devices is very limited, and it is difficult to implement large battery modules within the compact mobile devices. Therefore, users must re-charge their mobile device frequently or they must bring extra battery module for battery replacement. In addition, the mobile devices performing computations at high-speed generate a lot of heat, which accumulates around high energy-consumption elements or heating elements (e.g., central processors, graphics chips or power management chips, etc.), such that the users might feel discomforts or burning pains when they hold the mobile devices with their palms.

SUMMARY

An aspect of the present disclosure is to provide a protective cover, which is removably attached on an outer surface of a mobile device. The protective cover includes an outer protective layer, a thermo-conductive layer and a thermoelectric material layer. The thermo-conductive layer is attached on the outer surface of the mobile device. The thermoelectric material layer has a first side adjacent to the thermo-conductive layer and a second side adjacent to the outer protective layer. The thermoelectric material layer is configured for generating a current according to a temperature difference between the first side and the second side.

Another aspect of the present disclosure is to provide an electronic apparatus. The electronic apparatus includes a mobile device and a protective cover. The mobile device includes an outer surface and a connection point disposed on the outer surface. The protective cover is removably attached on the outer surface of the mobile device. The protective cover includes an outer protective layer, a thermo-conductive layer and a thermoelectric material layer. The thermo-conductive layer is attached on the outer surface of the mobile device. The thermoelectric material layer has a first side adjacent to the thermo-conductive layer and a second side adjacent to the outer protective layer. The thermoelectric material layer is configured for generating a current according to a temperature difference between the first side and the second side. When the protective cover is attached on the outer surface of the mobile device, the thermo-conductive layer is coupled to the connection point, and the mobile device receives the current through the connection point.

The disclosure provides a protective cover, which is capable of protecting the mobile device and recycling waste heat generated by the mobile device with the thermoelectric material layer disposed in the protective cover for generating a converted voltage fed back to the mobile device. In addition, the thermo-conductive layer is utilized to distribute the heat on the outer surface and diverged from the mobile device to different horizontal locations, such that the heat can be distributed evenly on the surface of the protective cover to avoid uncomfortable feeling while holding the protective cover.

BRIEF DESCRIPTION OF THE DRAWINGS

The disclosure can be more fully understood by reading the following detailed description of the embodiments, with reference made to the accompanying drawings as follows.

DETAILED DESCRIPTION

As mobile devices are required to be slim, compact and portable, internal components within the mobile devices are usually meticulous, fragile and easy to be damaged under an external force. Therefore, some users tend to cover their mobile devices with protective covers for protecting the mobile devices. In addition, the protective covers can also prevent the mobile device from being scratched or attired. The protective covers usually have various designs (e.g., different patterns, colors or shapes) which can show personalities of the owners. Therefore, the protective covers are important accessories to the mobile devices in these days.

Figure 1A:
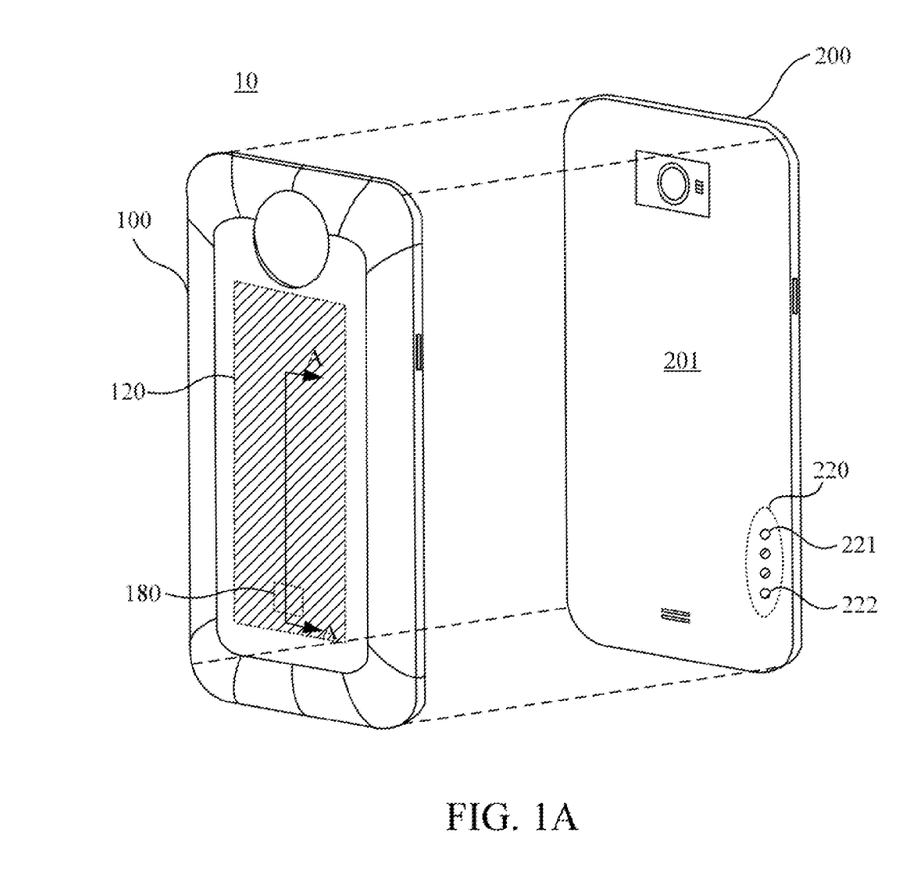
FIG. 1A is a schematic diagram illustrating an electronic apparatus according to an embodiment of the disclosure.
Figure 1B:
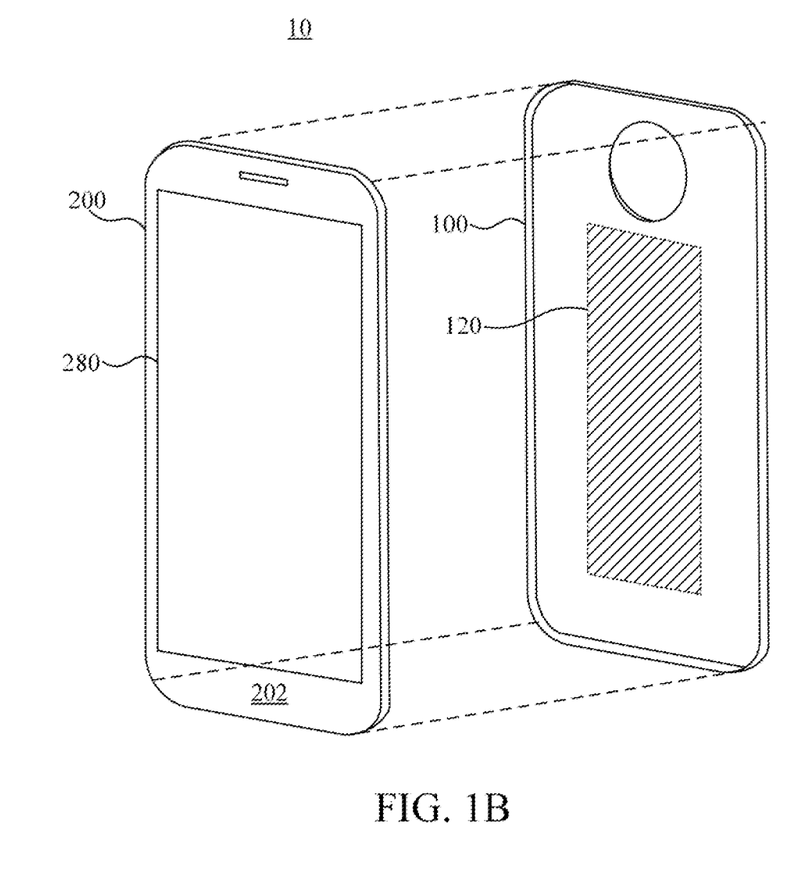
FIG. 1B is a schematic diagram illustrating the electronic apparatus from another visual angle.

Reference is made to FIG. 1A, which is a schematic diagram illustrating an electronic apparatus 10 according to an embodiment of the disclosure. As shown in FIG. 1A, the electronic apparatus 10 includes a protective cover 100 and a corresponding mobile device 200. The protective cover 100 is removably attached onto an outer surface 201 of the mobile device 200. In the embodiment, the outer surface 201 is a back surface of the mobile device 200. Reference is also made to FIG. 1B, which is a schematic diagram illustrating the electronic apparatus 10 from another visual angle. As shown in FIG. 1B, another outer surface 202 on the opposite side of the mobile device 200 is a front surface. In the embodiment, a displaying unit 280 is disposed on the outer surface 202.

As shown in FIG. 1A, a shape of the protective cover 100 fits the outer surface 201 of the mobile device 200. In other words, the shape of the protective cover 100 is symmetrical and complementary to the outer surface 201 of the mobile device 200. An inner side of the protective cover 100 forms an accommodation space (as shown in FIG. B) for accommodating the mobile device 200. The protective cover 100 is attached onto the outer surface 201. An orientation of the outer surface 201, where the protective cover 100 is attached, is opposite to an orientation of the outer surface 202 where the displaying unit 280 is disposed.

When the user attaches the protective cover 100 onto the outer surface 201 of the mobile device 200, the protective cover 100 is closely integrated to the mobile device 200 by a specific engaging structure. For example, an opening of the accommodation space of the protective cover 100 is narrowed down slightly, such that the mobile device 200 is clamped within the accommodation space of the protective cover 100, but the engaging structure is not limited thereto. In other embodiments, there are many ways (e.g., latches, screws, knots, stoppers or other equivalent manners) to engage the mobile device 200 and the protective cover 100. The engaging manners are known by a person in the art and not further mentioned herein.

It is noticed that, the protective cover 100 is an extra protective case outside an original casing of the mobile device 200. The protective cover 100 can be removed or replaced easily. The protective cover 100 has a relative simple structure and is easy to manufacture. When the protective cover 100 is damaged, the user can buy a new protective cover 100 and attached the new one onto the mobile device 200.

Figure 2:
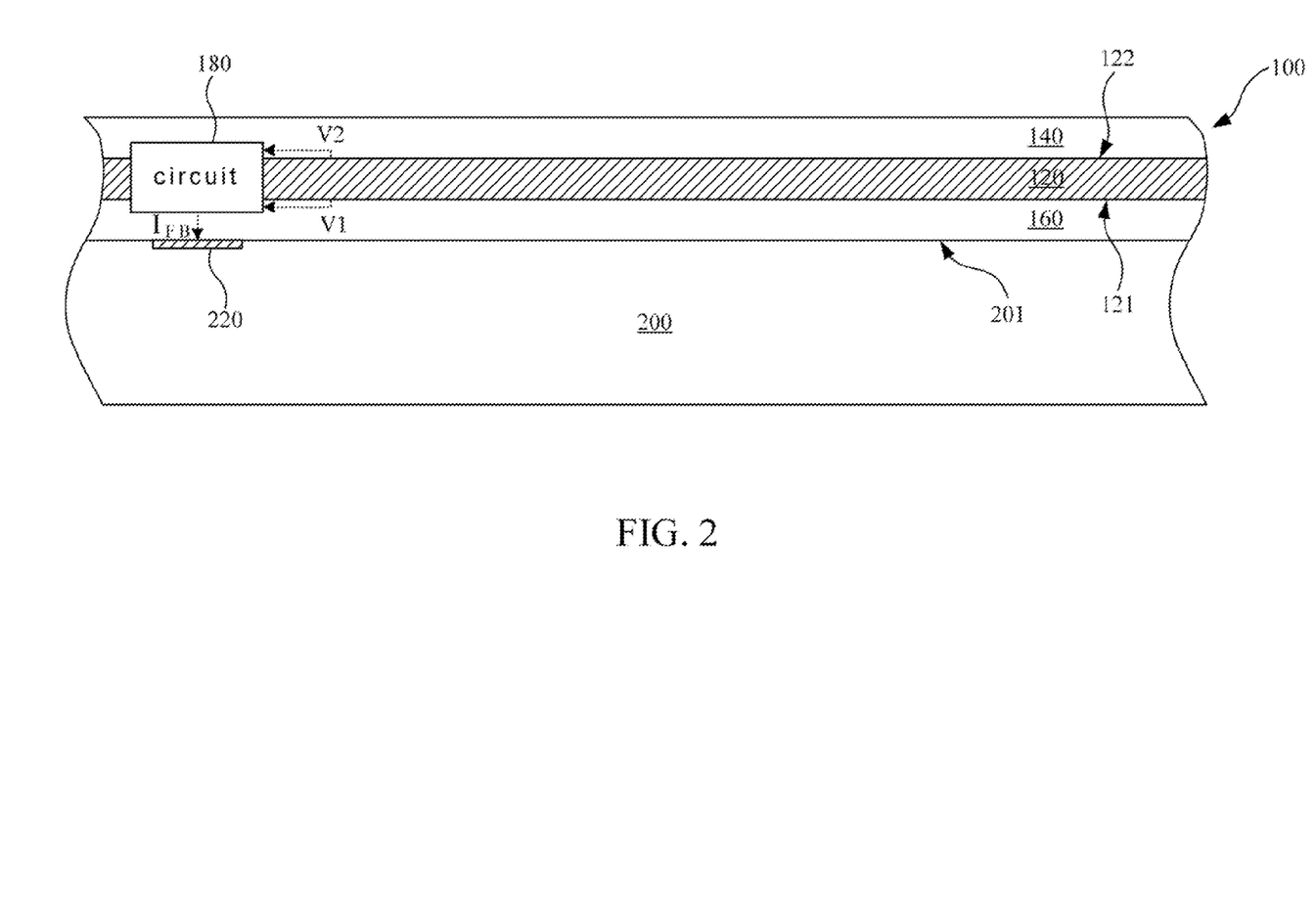
FIG. 2 is a sectional diagram illustrating the protective cover according to an embodiment shown in FIG. 1.

Reference is made to FIG. 1A and FIG. 2. FIG. 2 is a sectional diagram illustrating the protective cover 100 according to an embodiment shown in FIG. 1. As shown in figures, the protective cover 100 includes an outer protective layer 140, a thermoelectric material layer 120 and a thermo-conductive layer 160 in sequence. The outer protective layer 140 is located at the outermost side (i.e., the side away from the mobile device 200). The thermo-conductive layer 160 is located at the innermost side (i.e., the side adjacent to the mobile device 200). In the disclosure, the thermoelectric material layer is utilized to recycle the waste heat generated from the mobile device 200, and feedback the recycled energy to the mobile device 200 for prolonging a battery durability of the mobile device 200. Details of these behaviors are disclosed in following paragraphs.

The outer protective layer 140 is utilized to buffer an external force and protect the mobile device 200. When the mobile device 200 with the protective cover 100 attached is dropped on the ground or impacted by the external force, the outer protective layer 140 is the first surface to encounter the collision or contact from the external force. In an embodiment, the outer protective layer 140 is a plastic layer with certain flexibility. The flexibility of the outer protective layer 140 is utilized to buffer the external force. Besides, the outer protective layer 140 can be a heat-isolation layer in addition. In this case, the user will not feel the heat generated by the mobile device 200 while holding on the outer protective layer 140, so as to elevate the user's experience.

The thermo-conductive layer 160 is closely attached and contacted onto the outer surface 201 of the mobile device 200. In the embodiment, the thermo-conductive layer 160 can be a metal layer, which is configured for distributing heat from the outer surface 201 and evenly dispersing the heat to different locations of the thermo-conductive layer 160. As shown in FIG. 2, the thermo-conductive layer 160 conducts the heat on the outer surface 201 horizontally and distributes the heat to different horizontal locations. The thermo-conductive layer 160 adopts a material or an alloy selected from the group consisted of magnesium, aluminum and other metal material with high thermal conductivity.

In this case, the waste heat highly concentrated around heating elements (e.g., central processors, graphics chips or power management chips, etc.) of the mobile device 200 can be distribute evenly to different locations by the thermo-conductive layer 160. Therefore, the user might not feel discomforts or burning pains while holding the mobile devices, so as to elevate the user's experience of manipulating the mobile device 200.

In this embodiment, the thermoelectric material layer 120 is disposed between the outer protective layer 140 and the thermo-conductive layer 160. The thermoelectric material layer 120 has a first side 121 adjacent to the thermo-conductive layer 160 and a second side 122 adjacent to the outer protective layer 140. According to characteristics of the thermoelectric material, when there is temperature difference existed between the first side 121 and the second side 122 of the thermoelectric material layer 120, the thermoelectric material layer 120 will form a corresponding voltage difference of thermoelectric conversion between the first side 121 and the second side 122. The voltage difference formed by the thermoelectric material layer 120 is utilized to generate a current, which is fed back to the mobile device 200.

In practical applications, the first side 121 of the thermoelectric material layer 120 is adjacent to the thermo-conductive layer 160 and near the mobile device 200 (where the heat source is located). When the mobile device 200 is operating, a temperature on the first side 121 of the thermoelectric material layer 120 is usually higher; in the meantime, the second side 122 of the thermoelectric material layer 120 is adjacent to the outer protective layer 140, and a temperature on the second side 122 of the thermoelectric material layer 120 is usually close to an ambient temperature at the present time. A first voltage level is formed on the first side 121 of the thermoelectric material layer 120, and a second voltage level is formed on the second side 122 of the thermoelectric material layer 120. Therefore, the thermoelectric material layer 120 form the corresponding voltage difference Vg of thermoelectric conversion (not shown in figures) according to the temperature difference existed between the first side 121 and the second side 122, and the voltage difference of thermoelectric conversion $Vg=|V2-V1|$. The voltage difference of thermoelectric conversion is utilized to form the current sent back to the mobile device 200.

It is noticed that, the implemented range of the thermoelectric material layer 120 shown in FIG. 1A is for exemplary. The range of the thermoelectric material layer 120 in some practical applications cover the entire protective cover 100, or selectively covers a position corresponding to the main heat-generating elements of the mobile device 200, and is not limited to the embodiment shown in FIG. 1A.

As shown in FIG. 1A and FIG. 2, there are connection points 220 disposed on the outer surface 201 of the mobile device 200. In the embodiment, the connection points 220 include plural metal connection points on the outer surface 201. The metal connection points (i.e., the connection points 220) can be utilized in some purposes such as re-charging/discharging, file transmitting, state signal confirming, etc. The connection points 220 include a re-charging connection point 221 with positive voltage level (e.g., V+) and another re-charging connection point 222 with negative voltage level (e.g., V−).

In the embodiment, the protective cover further includes a circuit 180. The circuit 180 is coupled to the connection point 220 and the thermoelectric material layer 120. The circuit 180 in some embodiment includes some electricity modulation components (not shown in figures) such as a voltage-elevating circuit, a voltage-stabilizer circuit, a filter circuit, etc. The circuit 180 is utilized to extract the current $I_{FB}$ induced from the voltage difference of thermoelectric conversion between two sides of the thermoelectric material layer 120, and also to transmitting the current $I_{FB}$ to the re-charging connection points 221 and 222 of the connection points 220.

However, the protective cover 100 of the disclosure is not limited to include the circuit 180. In practical applications, the current $I_{FB}$, which is induced from the voltage difference of thermoelectric conversion between two sides of the thermoelectric material layer 120, can be fed back via a connection wiring directly to the re-charging connection points 221 and 222 of the connection points 220. The current $I_{FB}$ is further processed and utilized by a re-charging circuit implemented within the mobile device 200, such that the manufacturing cost for implementing the circuit 180 in the protective cover 100 is avoided.

Figure 3:
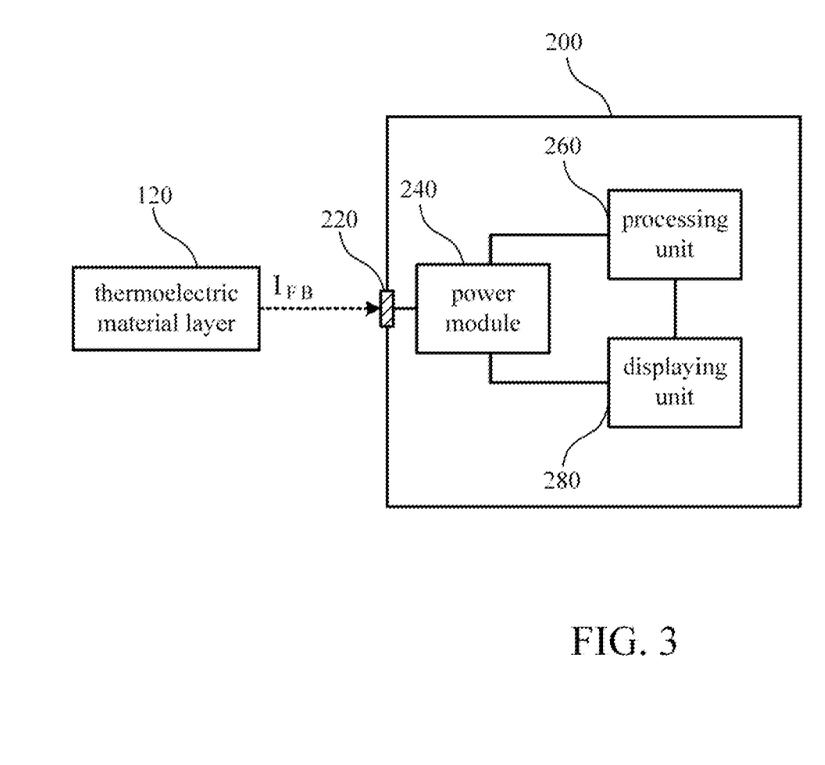
FIG. 3 is a functional block diagram illustrating a mobile device according to an embodiment shown in FIG. 1A.

Reference is made to FIG. 3, which is a functional block diagram illustrating a mobile device 200 according to an embodiment shown in FIG. 1A. As shown in FIG. 3, the mobile device 200 in FIG. 1A includes a power module 240, a processing unit 260 and a displaying unit 280. The power module 240 is coupled to the processing unit 260, the displaying unit 280 and the connection points 220. The power module 240 provides a power (i.e., electricity) to the processing unit 260 and the displaying unit 280. The displaying unit is utilized to display a screen generated by the processing unit 260.

Reference is made to FIG. 2 and FIG. 3 at the same time, the thermoelectric material layer 120 is coupled to the power module 240 through the circuit 180 and the connection points 220 (or in other embodiments, the thermoelectric material layer 120 is coupled to the power module 240 through the connection points 220 without passing through the circuit 180). As shown in FIG. 3, the current $I_{FB}$ generated by the thermo-conductive layer 120 is utilized to re-charge the power module 240. The power module 240 in some embodiments includes a rechargeable battery or other types of energy storages.

Figure 4:
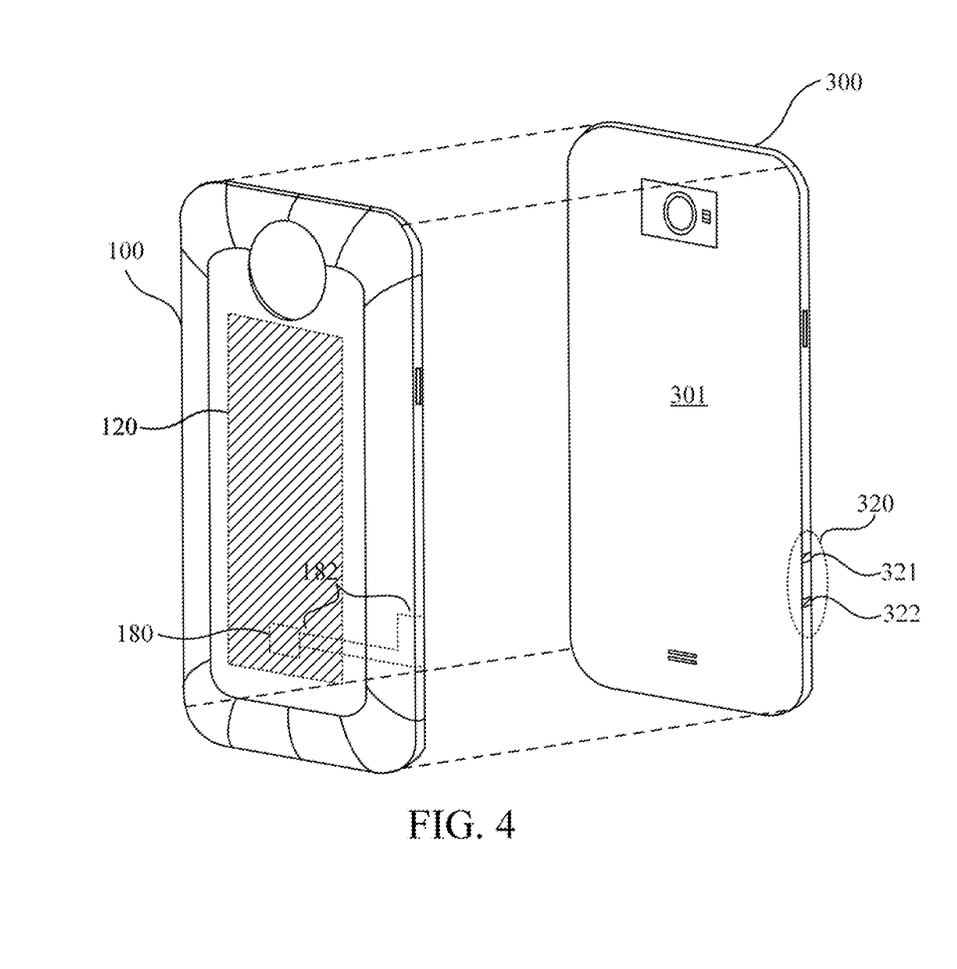
FIG. 4 is a schematic diagram illustrating an electronic apparatus according to an embodiment of the disclosure.

In the embodiment shown in FIG. 1A, the connection points 220 of the mobile device 200 is disposed on the back side of the mobile device 200, but the disclosure is not limited thereto. Reference is made to FIG. 4, which is a schematic diagram illustrating an electronic apparatus 11 according to an embodiment of the disclosure. In the embodiment shown in FIG. 4, the electronic apparatus 11 include the protective cover disclosed in aforesaid embodiments and another mobile device 300. In the embodiment shown in FIG. 4, the connection points 320 are metal pins disposed on a side frame of the outer surface 301 of the mobile device 300. In the embodiment shown in FIG. 4, the circuit 180 (or both sides of the thermoelectric material layer 120) of the protective cover 100 is connected to the connection point 320 (such as re-charging connection points 321 and 322) of the mobile device 300 via a connection wiring 182.

In other words, the protective cover 100 can be adopted on mobile devices with various designs of connection points (e.g., metal connection points on the back side, metal pins on the side frame, or any other equivalent designs).

Based on aforesaid embodiments, the disclosure provides a protective cover, which is capable of protecting the mobile device and recycling waste heat generated by the mobile device with the thermoelectric material layer disposed in the protective cover for generating a converted voltage fed back to the mobile device. In addition, the thermo-conductive layer is utilized to distribute the heat on the outer surface and diverged from the mobile device to different horizontal locations, such that the heat can be distributed evenly on the surface of the protective cover to avoid uncomfortable feeling while holding the protective cover.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present application.

It will be apparent to those skilled in the art that various modifications and variations can be made to the structure of the present application without departing from the scope or spirit of the application. In view of the foregoing, it is intended that the present application cover modifications and variations of this application provided they fall within the scope of the following claims.

What is claimed is:

1. A protective cover, removably attached on an outer surface of a mobile device, the protective cover comprising:
   an outer protective layer, located on an outermost side of the protective cover away from the outer surface of the mobile device for buffering an external force;
   a thermo-conductive layer attached on the outer surface of the mobile device, and located on an innermost side of the protective cover adjacent to the outer surface of the mobile device for distributing heat from the outer surface of the mobile device; and
   a thermoelectric material layer having a first side adjacent to the thermo-conductive layer and a second side adjacent to the outer protective layer, the thermoelectric material layer being configured for generating a current according to a temperature difference between the first side and the second side,
   wherein the mobile device is a heat source while the mobile device is operating;
   wherein a connection point is disposed on the outer surface of the mobile device, and the protective cover further comprises:
   a circuit coupled between the connection point and the thermoelectric material layer, wherein the circuit is configured for transmitting the current to the connection point to feed back the current to the mobile device to thereby recycle a waste heat by the thermoelectric material layer disposed in the protective cover; wherein the waste heat is generated by the mobile device.

2. The protective cover of claim 1, wherein the thermo-conductive layer is a metal layer configured for evenly dispersing the heat to different locations of the thermo-conductive layer.

3. The protective cover of claim 2, wherein the thermo-conductive layer adopts a material or an alloy selected from the group consisted of magnesium, aluminum and other metal material with high thermal conductivity.

4. The protective cover of claim 1, wherein the outer protective layer is a plastic layer or a thermal-insulation material layer.

5. The protective cover of claim 1, wherein a shape of the protective cover fits the outer surface of the mobile device, such that the protective cover is closely attached onto the mobile device and the outer protective layer is configured for protecting the mobile device.

6. An electronic apparatus, comprising:
a mobile device comprising an outer surface, a connection point being disposed on the outer surface; and
a protective cover removably attached on the outer surface of the mobile device, the protective cover comprising:
an outer protective layer, located on an outermost side of the protective cover away from the outer surface of the mobile device for buffering an external force;
a thermo-conductive layer attached on the outer surface of the mobile device, and located on an innermost side of the protective cover adjacent to the outer surface of the mobile device for distributing heat from the outer surface of the mobile device; and
a thermoelectric material layer having a first side adjacent to the thermo-conductive layer and a second side adjacent to the outer protective layer, the thermoelectric material layer being configured for generating a current according to a temperature difference between the first side and the second side,
wherein the mobile device is a heat source while the mobile device is operating, and when the protective cover is attached on the outer surface of the mobile device, the thermo-conductive layer is coupled to the connection point, and the mobile device receives the current through the connection point;
wherein the protective cover further comprises:
a circuit coupled between the connection point and the thermoelectric material layer, wherein the circuit is configured for transmitting the current to the connection point to feed back the current to the mobile device to thereby recycle a waste heat by the thermoelectric material layer disposed in the protective cover; wherein the waste heat is generated by the mobile device.

7. The electronic apparatus of claim 6, wherein the thermo-conductive layer is a metal layer configured for evenly dispersing the heat to different locations of the thermo-conductive layer.

8. The electronic apparatus of claim 7, wherein the thermo-conductive layer adopts a material or an alloy selected from the group consisted of magnesium, aluminum and other metal material with high thermal conductivity.

9. The electronic apparatus of claim 7, wherein the outer protective layer is a plastic layer or a thermal-insulation material layer.

10. The electronic apparatus of claim 7, wherein a shape of the protective cover fits the outer surface of the mobile device, such that the protective cover is closely attached onto the mobile device and the outer protective layer is configured for protecting the mobile device.

11. The electronic apparatus of claim 7, wherein the mobile device further includes a power module, a processing unit and a displaying unit, the power module is coupled to the processing unit, the displaying unit and the connection point, the power module provides a power to the processing unit and the displaying unit, when the thermo-conductive layer is coupled to the power module via the connection point, the thermo-conductive layer is utilized to charge the power module by the current generated by the thermo-conductive layer.

12. The electronic apparatus of claim 7, wherein an orientation of the outer surface is opposite to an orientation of the displaying unit.

\* \* \* \* \*